(12) United States Patent
Gao

(10) Patent No.: US 9,351,084 B2
(45) Date of Patent: May 24, 2016

(54) PACKAGING CONCEPT TO IMPROVE PERFORMANCE OF A MICRO-ELECTRO MECHANICAL (MEMS) MICROPHONE

(71) Applicant: INVENSENSE, INC., San Jose, CA (US)

(72) Inventor: Jia Gao, Winchester, MA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/330,788

(22) Filed: Jul. 14, 2014

(65) Prior Publication Data

US 2016/0014530 A1    Jan. 14, 2016

(51) Int. Cl.
| | |
|---|---|
| *H01L 29/84* | (2006.01) |
| *H04R 19/04* | (2006.01) |
| *H04R 19/00* | (2006.01) |
| *B81B 3/00* | (2006.01) |

(52) U.S. Cl.
CPC .............. *H04R 19/04* (2013.01); *H04R 19/005* (2013.01); *B81B 3/0094* (2013.01); *H01L 29/84* (2013.01)

(58) Field of Classification Search
CPC .............................. B81B 3/0094; H01L 29/84
USPC ..................................... 257/254, 704; 438/53
See application file for complete search history.

(56) References Cited

U.S. PATENT DOCUMENTS

| | | | |
|---|---|---|---|
| 8,617,934 B1 * | 12/2013 | Minervini ..................... 438/125 |
| 2006/0006483 A1 * | 1/2006 | Lee et al. ....................... 257/415 |
| 2007/0230734 A1 * | 10/2007 | Beard ............................ 381/361 |
| 2010/0183174 A1 * | 7/2010 | Suvanto et al. ............... 381/174 |
| 2010/0284553 A1 * | 11/2010 | Conti et al. .................... 381/174 |
| 2012/0212925 A1 * | 8/2012 | Zoellin et al. ................. 361/807 |
| 2013/0051598 A1 * | 2/2013 | Reining ......................... 381/355 |
| 2013/0129136 A1 * | 5/2013 | Harney et al. ................. 381/355 |
| 2014/0037120 A1 * | 2/2014 | Lim et al. ...................... 381/355 |
| 2014/0211957 A1 * | 7/2014 | Bolognia et al. ................ 381/74 |
| 2014/0264654 A1 * | 9/2014 | Salmon ......................... 257/416 |
| 2014/0299948 A1 * | 10/2014 | Wang et al. ................... 257/416 |

\* cited by examiner

*Primary Examiner* — George Fourson, III
(74) *Attorney, Agent, or Firm* — Amin, Turocy & Watson, LLP

(57) ABSTRACT

A size of a port hole in a package for a micro-electro-mechanical (MEMS) microphone can be modified to improve performance of the MEMS microphone while protecting the MEMS microphone from environmental interference. As an example, the port hole diameter is increased along a thickness of a substrate coupled to the MEMS microphone to reduce air mass loading and air flow resistance and thus, increase the resonant frequency, resonant peak, signal-to-noise ratio (SNR) and/or a range for flat frequency response of the MEMS microphone. In one aspect, the port hole can be created by mechanical and/or laser drilling. In another aspect, the port hole can be created by forming a cavity in the substrate over a drilled port hole.

24 Claims, 9 Drawing Sheets

PACKAGING CONCEPT TO IMPROVE PERFORMANCE OF A MICRO-ELECTRO MECHANICAL (MEMS) MICROPHONE

TECHNICAL FIELD

The subject disclosure relates to micro-electro-mechanical (MEMS) devices, e.g., to a packaging concept to improve performance of a MEMS microphone.

BACKGROUND

Micro-Electro-Mechanical Systems (MEMS) is a widely used technology that enables integration of both microelectronic circuits and mechanical structures on the same chip, while significantly lowering fabrication costs and chip size. For at least these reasons MEMS microphones are being widely used in consumer electronic devices, such as, mobile phones, tablet computers, laptops, gaming devices, etc. Typically, MEMS microphones detect a change in a capacitance of a variable capacitor having a fixed back-plate and flexible membrane. The change in capacitance is caused by a sound wave, passing through a port hole in a package substrate, that moves the membrane modulating the air gap between the membrane and the fixed back-plate.

Conventionally, the size of the port hole is kept small to protect the device from environment interference (e.g., particles, light and solder flux from a surface-mount technology process, etc.). Further, the port hole size is fixed by customers based on their board design. However, the small port hole has negative impact on microphone performance. Moreover, with smaller port holes, mass loading due to air inside front volume, formed between port hole and MEMS backside cavity, is increased, which in turn leads to a decrease in a resonant frequency, a lower resonant peak, a lower signal-to-noise ratio (SNR) and narrower range for flat frequency response of the MEMS microphone.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

The systems and methods described herein, in one or more embodiments thereof, relate to improving the performance of a micro-electro-mechanical (MEMS) microphone device while protecting the MEMS microphone device from external interference. In one aspect, the system disclosed herein comprises MEMS microphone device and a substrate coupled to the MEMS microphone device, wherein the substrate comprises a port hole that has different diameters along a thickness of the substrate. Further, an aspect of the disclosed subject matter relates to a method that comprises coupling a MEMS microphone device to a substrate and forming a port hole within the substrate, wherein the port hole has different diameters along a thickness of the substrate.

Furthermore, yet another aspect of the disclosed subject matter relates to a system for sensing audio signals that comprises a MEMS device that facilitates a conversion of an acoustic signal into an electrical signal and an aperture within a substrate coupled to the MEMS device, though which the acoustic signal is received, wherein the aperture has a non-uniform diameter along a thickness of the substrate.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

The numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1A:
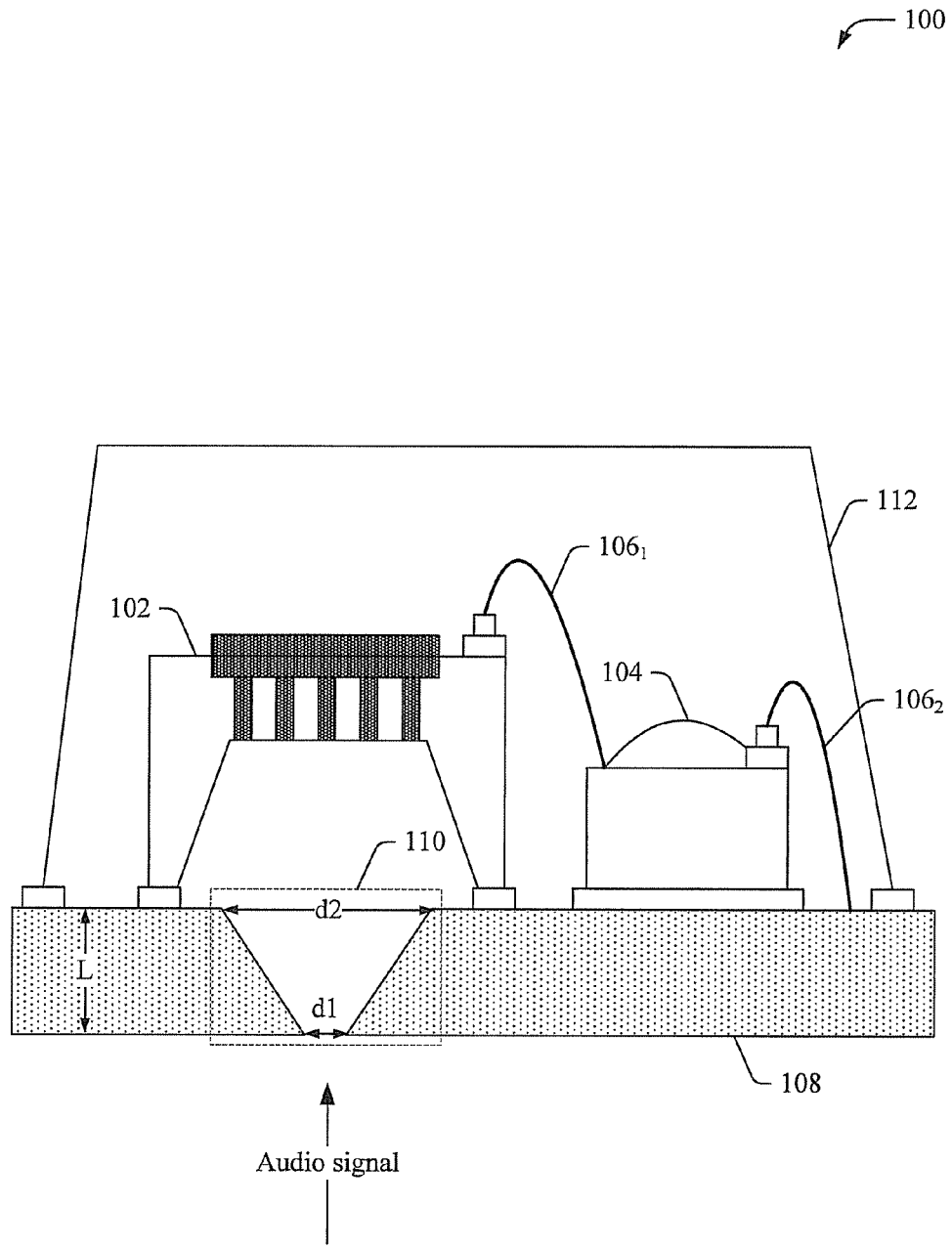
FIGS. 1A and 1B illustrate example systems that can be utilized for sensing an acoustic/audio signal.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

Systems and methods disclosed herein, in one or more aspects improve a performance of micro-electro-mechanical (MEMS) microphone devices by modifying shape of port holes created in a package substrate. The subject matter is described with reference to the drawings, wherein like reference numerals are used to refer to like elements throughout. In the following description, for purposes of explanation, numerous specific details are set forth in order to provide a thorough understanding of the subject innovation. However, that the subject matter may be practiced without these specific details.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. In addition, the word "coupled" is used herein to mean direct or indirect electrical or mechanical coupling. In addition, the words "example" and/or "exemplary" are used herein to mean serving as an example, instance, or illustration. Any aspect or design described herein as "example" and/or "exemplary" is not necessarily to be construed as preferred or advantageous over other aspects or designs. Rather, use of the word exemplary is intended to present concepts in a concrete fashion.

Figure 1B:
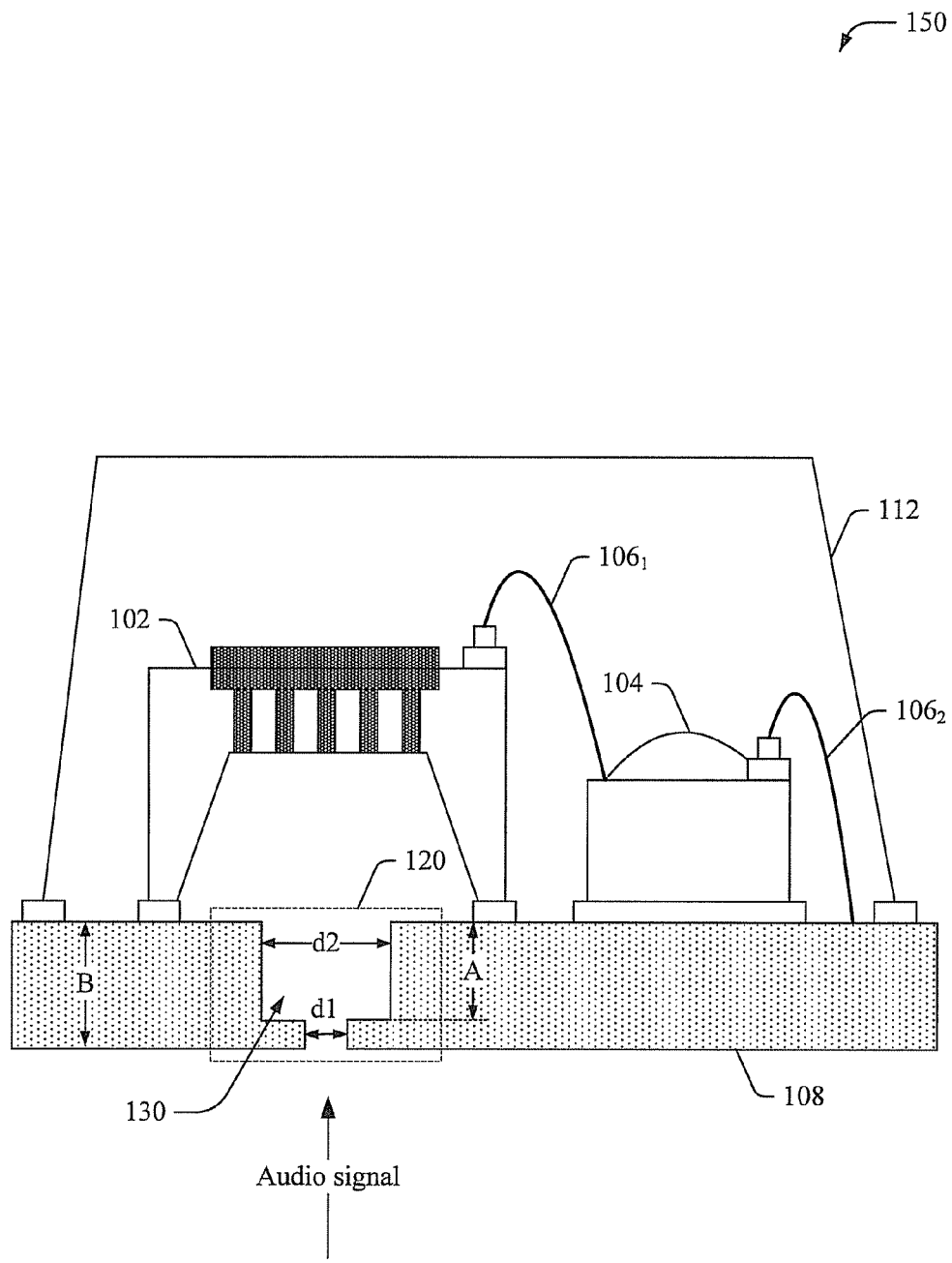

Initially, referring to FIGS. 1A and 1B, there illustrated are example systems 100 and 150 that can be utilized for sensing an acoustic/audio signal. The systems 100 and 150 can include most any electrical device that converts an audio signal (e.g., sound waves) into mechanical vibrations and/or electrical signals. As an example, systems 100 and 150 can be utilized in various applications, such as, but not limited to, wireless devices, industrial systems, automotive systems, robotics, telecommunications, security, medical/bio-medical devices, etc. In one aspect, the systems 100 and 150 can include a MEMS microphone 102 for detecting acoustic waves.

The MEMS microphone 102 is a solid state integrated circuit (IC) that can be analog, for example, that converts the audio signal into a corresponding voltage signal or digital, for example, that converts the audio signal into a digital output (e.g., a pulse density modulation (PDM) signal). The MEMS microphone 102 can comprise a fixed plate (back-plate) and a movable plate (membrane) and can measure a capacitive change between the fixed plate and the movable plate. The capacitive change is generated when the audio signal passes through the MEMS microphone and moves the membrane modulating the air gap comprised between the two conductive plates. The output of the MEMS microphone 102 can be provided to an application-specific integrated circuit (ASIC) 104 (e.g., analog or digital) for further signal processing. In one example, the MEMS microphone 102 can be coupled to the ASIC 104 via a wire bond $106_1$ and the ASIC 104 can be coupled to a substrate 108 via another wire bond $106_2$.

The packaging for the MEMS microphone 102 comprises a port hole 110 in a substrate 108 for the audio signal to reach the transducer element. Inside this package, the MEMS microphone 102 and the ASIC 104 are bonded together and mounted on the common substrate 108. As an example, the substrate 108 can comprise a printed circuit board, ceramic, molded package, laminate, and/or leadframe, etc. In one example, the substrate 108 can route signals from the ICs to the pins on the outside of the microphone package. Further, a lid/shield 112 can be bonded over the substrate 108 to enclose the MEMS microphone 102 and the ASIC 104.

The size of the port hole 110 is a limiting factor to achieve higher microphone performance. Although a small port hole is preferred for protecting device from environment interference, particles, light, and/or solder flux from a surface-mount technology (SMT) process, the small port hole has a negative impact on microphone performance. Moreover, small port holes increase mass loading due to air inside front volume formed between port hole and MEMS backside cavity, which in turn decreases resonant frequency, lowers resonant peak, lowers signal-to-noise ratio (SNR) and reduces range for flat frequency response of the MEMS microphone 102, as seen from the equations below:

$$m = \frac{\rho \times L}{\pi \times \left(\frac{D}{2}\right)^2} \quad (1)$$

$$R = \frac{8 \times \mu \times L}{\pi \times \left(\frac{D}{2}\right)^4} \quad (2)$$

Wherein, D is the port hole diameter; L is the port hole length; ρ is the density of air; m is mass loading through the port hole; μ is the viscosity of air and R is the acoustic resistance through the port hole. Further, the resonant frequency and flat frequency range of the MEMS microphone 102 depends on the mass loading, as noted below:

$$\omega_0 = \sqrt{\frac{k}{m_1 + m_2}} \quad (3)$$

Wherein, k is the equivalent mechanical stiffness of the microphone diaphragm; $m_1$ is the mass of the microphone diaphragm; $m_2$ is the mass loading through the port hole; and $\omega_0$ is the resonant frequency of the microphone diaphragm. The microphone flat frequency range is increased by increasing resonant frequency $\omega_0$. Furthermore, the thermal noise of the MEMS microphone 102 depends on the acoustic resistance, as noted below:

$$V_n = \sqrt{4k_B T \Delta f R} \quad (4)$$

Wherein, $V_n$ is the root mean square (RMS) noise voltage of the MEMS microphone 102; $k_B$ is the Boltzman constant; T is the absolute temperature (in Kelvin); Δf is the bandwidth; and R is the acoustic resistance through the port hole. The microphone SNR is increased by reducing microphone noise without changing sensitivity.

According to the above equations (1)-(4), increasing a diameter (D) of the port hole and/or reducing the length (L) of the port hole reduces the acoustic mass and resistance, which in turn increases the resonant frequency and reduces the thermal noise of the MEMS microphone 102. However, as noted above, larger diameters for port holes can expose the MEMS microphone 102 to environmental interference, particles, light, and/or solder flux, which can reduce sensing accuracy and/or damage the MEMS microphone 102. In addition, customers typically have a fixed port hole size based on their board design so that the port hole matches and/or aligns with their mother board. Thus, referring back to FIGS. 1A and 1B, the diameter (d1) is generally fixed based on customer specifications and cannot be modified/increased.

According to an aspect, system 100 utilizes a differential port hole 110 which has small diameter (d1) at (or closer to) the bottom surface of the substrate 108 and a large diameter (d2) at (or closer to) the top surface of the substrate 108. As an example, the port hole diameter is increased along a thickness of the substrate 108 to reduce air mass loading and air flow resistance and thus, increase the resonant frequency, resonant peak, signal-to-noise ratio (SNR) and/or a range for flat frequency response of the MEMS microphone 102. However, since d1 is kept small, the MEMS microphone 102 is protected from environmental interference and/or disturbances. According to an aspect, the port hole 110 can be created by drilling (e.g., utilizing a mechanical or laser drill) a hole in the substrate 108. As an example, the non-uniform cross-sectional shape of the port hole 110 can be created by utilized different drill bits. Although, a trapezoidal cross-section for the port hole 110 is depicted in FIG. 1A, the subject disclosure is not so limited and the port hole 110 (and/or 120) can have any shape/size.

In one aspect, FIG. 1B illustrates an example system 150 for acoustic sensing, wherein the port hole 120 is constructed by creating a cavity 130 in the substrate 108, for example, a pre-molded/pre-formed cavity that can be created during fabrication of the substrate 108. As an example, the cavity 130 can be formed over a drilled hole by punch or laser drilling. Moreover, a hole with a uniform diameter (d1) can be drilled (e.g., via a mechanical or laser drilling process) and a cavity 130, for example, with a larger diameter (d2), can be created over the hole. To optimize performance the ratio of the length of the cavity (A) to the length of the substrate (B) is kept as close to 1 as possible. For example, A/B=0.6-0.7 (e.g., due to practical constraints, such as, but not limited to, limitations of the process, and/or to keep packaging robust during handling). In one example, for laminate substrates, the laser drilling process can be initiated after a surface finish process of the laminate substrate. During the laser drilling process, unwanted substrate material can be removed (e.g., burnt) to form the cavity. After the laser drilling process, an edging/cleaning process, for example, an auto edging system (AES) process can be implemented to make the edges of the formed cavity cleaner/smoother. Although, a single cavity 130 is depicted in FIG. 1B, the subject disclosure is not so limited and the port hole 120 (and/or 110) can comprise multiple cavities of different (or same) sizes.

Figure 2A:
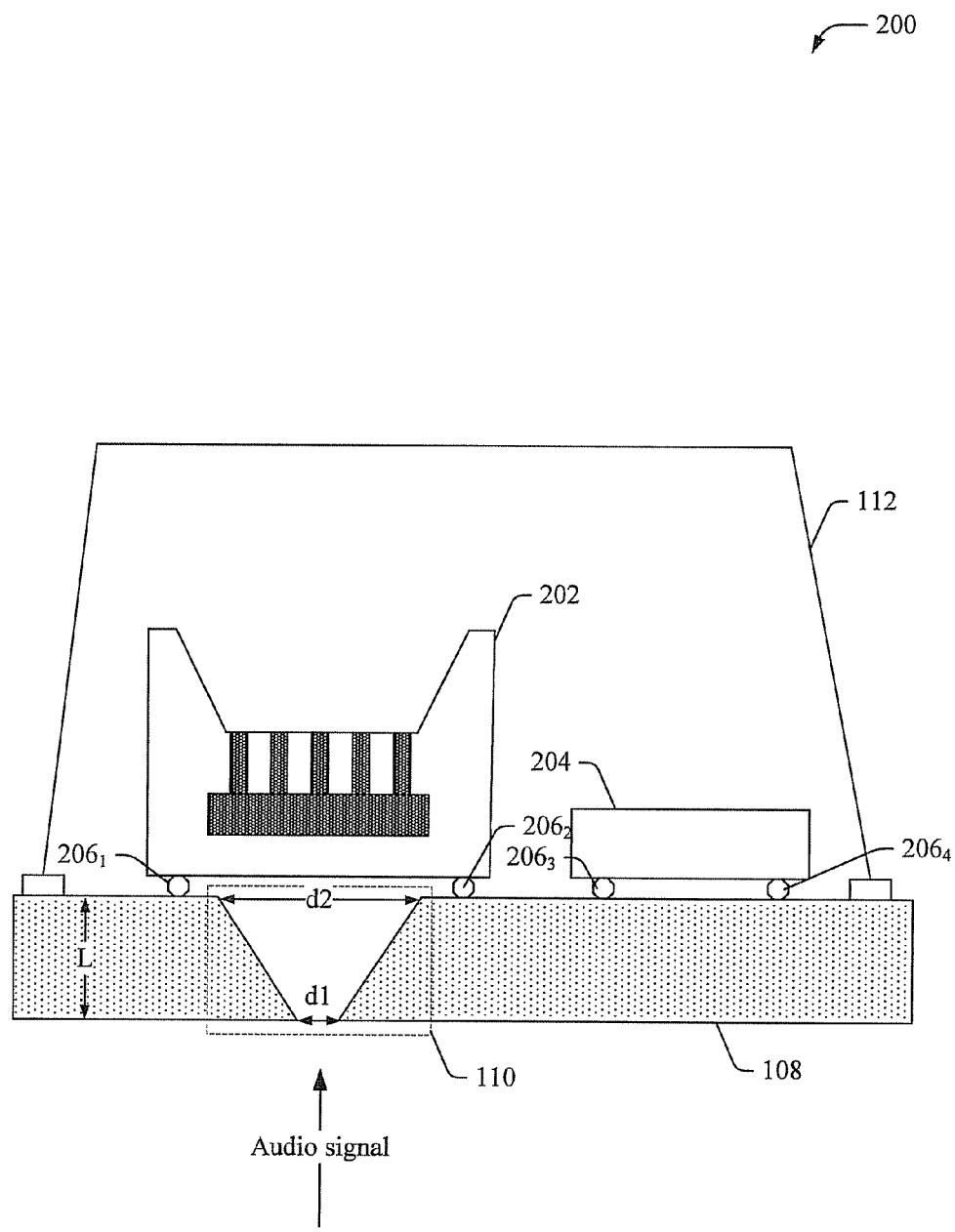
FIGS. 2A and 2B illustrate example systems comprising a MEMS microphone in a flip chip configuration that can be utilized for sensing an acoustic/audio signal.
Figure 2B:
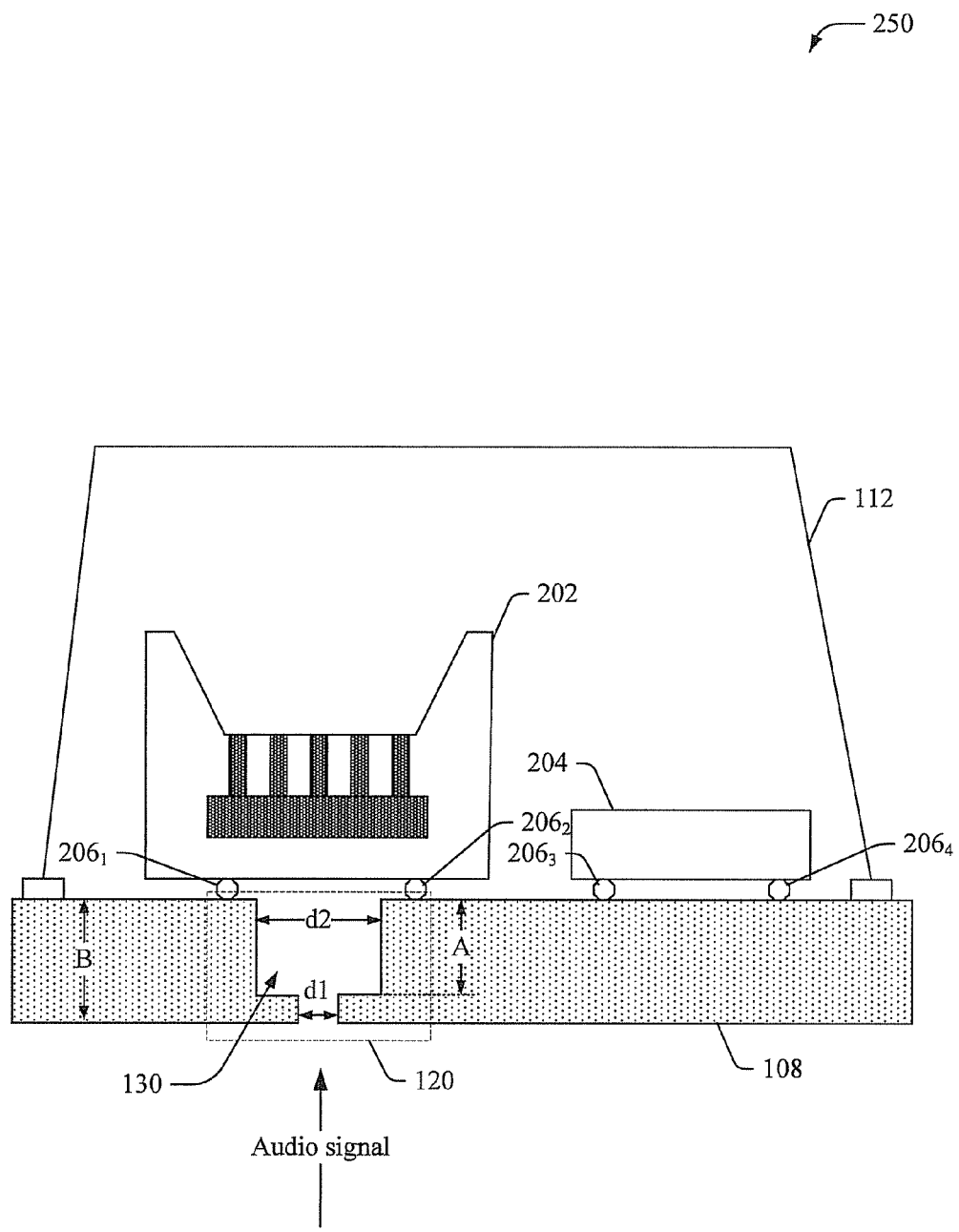

FIGS. 2A and 2B illustrate example systems 200 and 250 comprising a MEMS microphone 202 in a flip chip configuration (and/or having a controlled collapse chip connection) that can be utilized for detecting an acoustic/audio signal. In one aspect, the MEMS microphone 202 is electrically coupled to the substrate 108, for example, via a eutectic bond (e.g., an Aluminum-Germanium bond). Further, an ASIC 204 is also electrically coupled to the substrate 108, for example, via a eutectic bond (e.g., an Aluminum-Germanium bond). It is noted that the MEMS microphone 202 and the ASIC 204 can be substantially similar to the MEMS microphone 102 and the ASIC 104 respectively and can include functionality as more fully described herein, for example, as described above with regard to MEMS microphone 102 and the ASIC 104 respectively. In addition, it can be noted that the substrate 108, port hole 110, lid/shield 112, port hole 120 and cavity 130 can include functionality as more fully described herein, for example, as described above with regard to systems 100 and 150.

According to an embodiment, the MEMS microphone 202 and/or the ASIC 204 can be coupled to external circuitry (not shown), such as but not limited to a circuit board or another chip or wafer, with solder bumps ($206_1$-$206_4$) that have been deposited on the top side of the substrate 108. In this example scenario, the MEMS microphone 202 is flipped over so that its top side faces down towards the substrate 108. This is in contrast to systems 100 and 150, wherein the MEMS microphone 102 is mounted upright and wires are used to interconnect the MEMS microphone 102 to the external circuitry. In one example, to facilitate the flip chip configuration/connection, attachment pads of the MEMS microphone 202 are metalized during a manufacturing process to make them more receptive to solder that is deposited on each metalized pad. To attach the flip chip into a circuit, the chip is inverted to bring the solder dots down onto connectors on the underlying external circuit. The solder can then be re-melted to produce an electrical connection. Typically, the flip chip configuration/connection reduces a size of the packaging.

In an aspect, system 200 utilizes the differential port hole 110 which has smaller diameter (d1) at (or closer to) the bottom surface of the substrate 108 and a larger diameter (d2) at (or closer to) the top surface of the substrate 108, while system 250 utilizes the port hole 120 that comprises a cavity 130 in the substrate 108, for example, a pre-molded/pre-formed cavity that can be created during fabrication of the substrate 108. Since the diameter of the port holes 110 and 120 is increased along a thickness of the substrate 108, the air mass loading and air flow resistance is reduced and thus, the resonant frequency, resonant peak, signal-to-noise ratio (SNR) and/or a range for flat frequency response of the MEMS microphone 202 is increased. In addition, since d1 is kept small, the MEMS microphone 202 is protected from environmental interference and/or disturbances. Although, a trapezoidal cross-section for the port hole 110 is depicted in FIG. 2A, the subject disclosure is not so limited and the port hole 110 (and/or 120) can have any shape. Further, although, a single cavity 130 is depicted in FIG. 2B, the subject disclosure is not so limited and the port hole 120 (and/or 110) can comprise multiple cavities of different (or same) sizes.

Figure 3A:
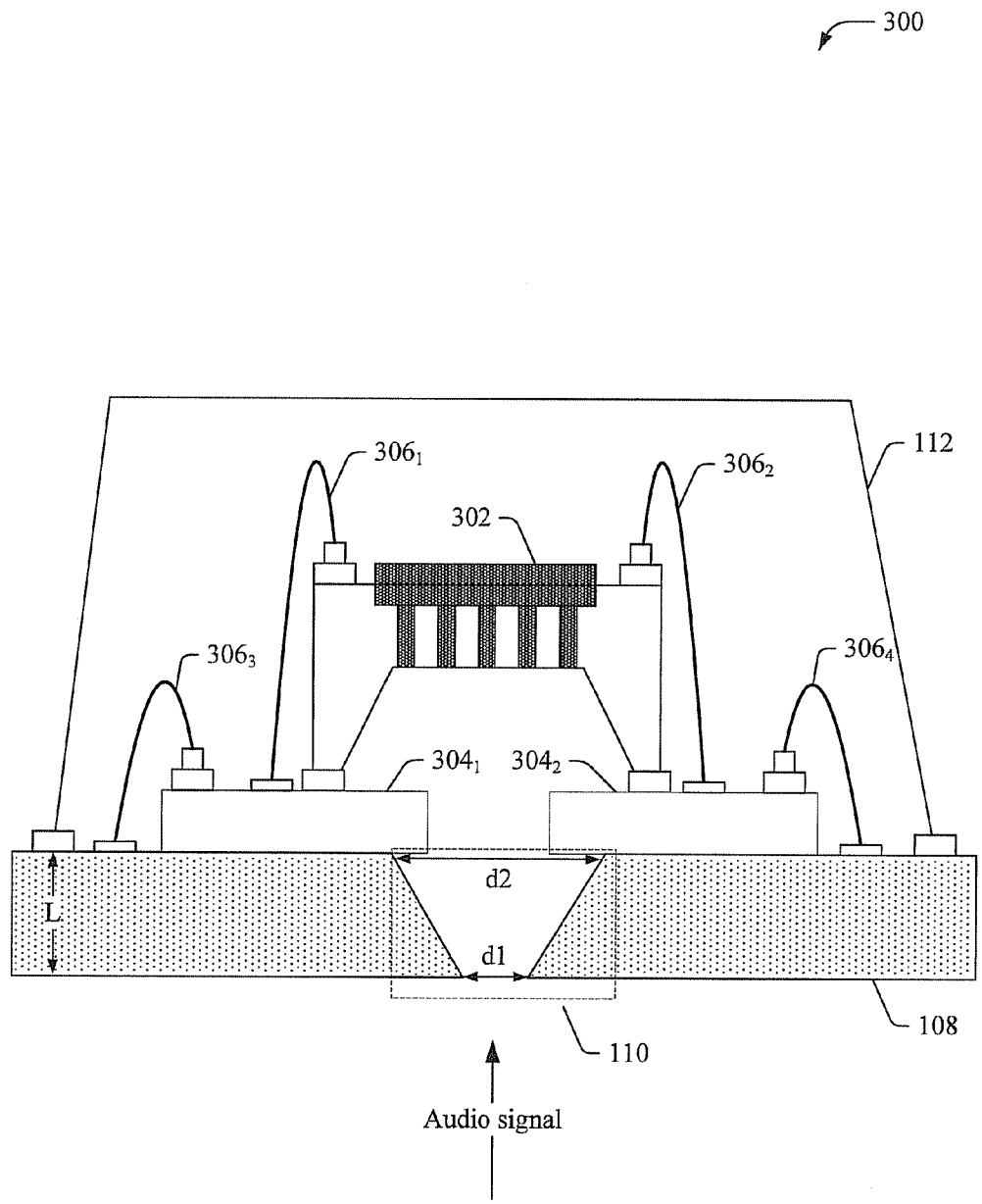
FIGS. 3A and 3B illustrate example systems depicting yet another implementation of an MEMS microphone that is utilized for sensing an acoustic/audio signal.
Figure 3B:
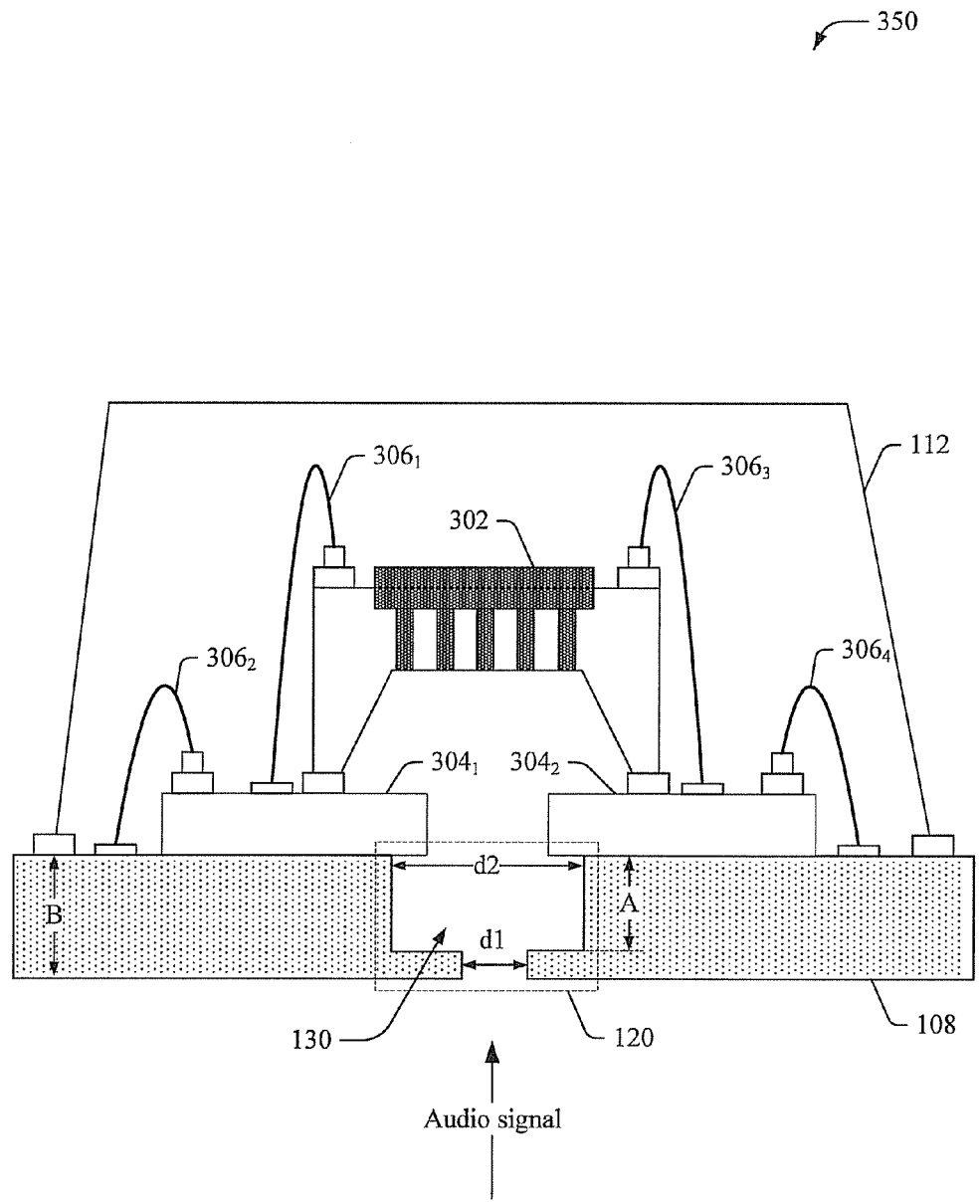

Referring now to FIGS. 3A and 3B, there illustrated are system 300 and 350 that depict yet another configuration for sensing acoustic/audio signals. In one aspect, the MEMS microphone 302 is placed upright over ASIC $304_1$ and $304_2$. The MEMS microphone 302 is coupled to the ASIC $304_1$ and $304_2$ via wire bonds $306_1$ and $306_2$ respectively and the ASIC $304_1$ and $304_2$ are coupled to the substrate 108 via wire bonds $306_3$ and $306_4$ respectively substrate 108. Alternatively, the MEMS microphone 302 can be coupled to the ASIC $304_1$ and $304_2$ and the ASIC $304_1$ and $304_2$ can be coupled to the substrate 108 via eutectic bonds (not shown), such as, but not limited to, an Aluminum-Germanium bond. It is noted that the MEMS microphone 302 and the ASIC $304_1$ and $304_2$ can be substantially similar to the MEMS microphones 102, 202 and the ASICs 104, 204 respectively, and can include functionality as more fully described herein, for example, as described above with regard to MEMS microphones 102, 202 and the ASICs 104, 204 respectively. In addition, it is noted that the substrate 108, port hole 110, lid/shield 112, port hole 120 and cavity 130 can include functionality as more fully described herein, for example, as described above with regard to systems 100, 150, 200, and 250.

According an aspect, system 300 utilizes the differential port hole 110 which has a smaller diameter (d1) at (or closer to) the bottom surface of the substrate 108 and a larger diameter (d2) at (or closer to) the top surface of the substrate 108, while system 350 utilizes the port hole 120 that comprises a cavity 130 in the substrate 108, for example, a pre-molded/pre-formed cavity that can be created during fabrication of the substrate 108. Since the diameter of the port holes 110 and 120 is increased along a thickness of the substrate 108, the air mass loading and air flow resistance is reduced and thus, the resonant frequency, resonant peak, signal-to-noise ratio (SNR) and/or a range for flat frequency response of the MEMS microphone 302 is increased. In addition, since d1 is kept small, the MEMS microphone 302 is protected from environmental interference and/or disturbances. As noted above, although, a trapezoidal cross-section for the port hole 110 is depicted in FIG. 3A, the subject disclosure is not so limited and the port hole 110 (and/or 120) can have any shape. Further, although, a single cavity 130 is depicted in FIG. 3B, the subject disclosure is not so limited and the port hole 120 (and/or 110) can comprise multiple cavities of different (or same) sizes.

Additionally, it is noted that the design of systems 100, 150, 200, 250, 300, and/or 350 can include different material selections, topologies, etc., to achieve efficient audio wave sensing. Moreover, it is noted that the MEMS microphones 102, 202, and/or 302, and the ASIC 104, 204, 304₁ and/or 304₂ can include most any components and circuitry elements of any suitable value in order to implement the embodiments of the subject innovation. In addition, although systems 100, 150, 200, 250, 300, and 350 depict the MEMS microphones 102, 202, and/or 302 to be aligned directly over the port holes (110 and/or 120), the subject specification is not that limited and the MEMS microphones 102, 202, and/or 302 can be partially aligned or misaligned with the port holes (110 and/or 120).

Further, although systems 100, 150, 200, 250, 300, and/or 350 depict port holes 110 and/or 120 as bottom port holes, the subject specification is not limited to bottom port holes and port holes 110 and/or 120 can comprise top port holes that are created within a top substrate (e.g., wherein the MEMS microphone is placed between two substrates). In addition, the substrate 108 can include multiple port holes (e.g., 110 and/or 120) or same of different sizes/shapes that are created by the same and/or different processes. Furthermore, it can be appreciated that the components of systems 100, 150, 200, 250, 300, and/or 350 can be implemented on one or more integrated circuit (IC) chips.

Figure 4:
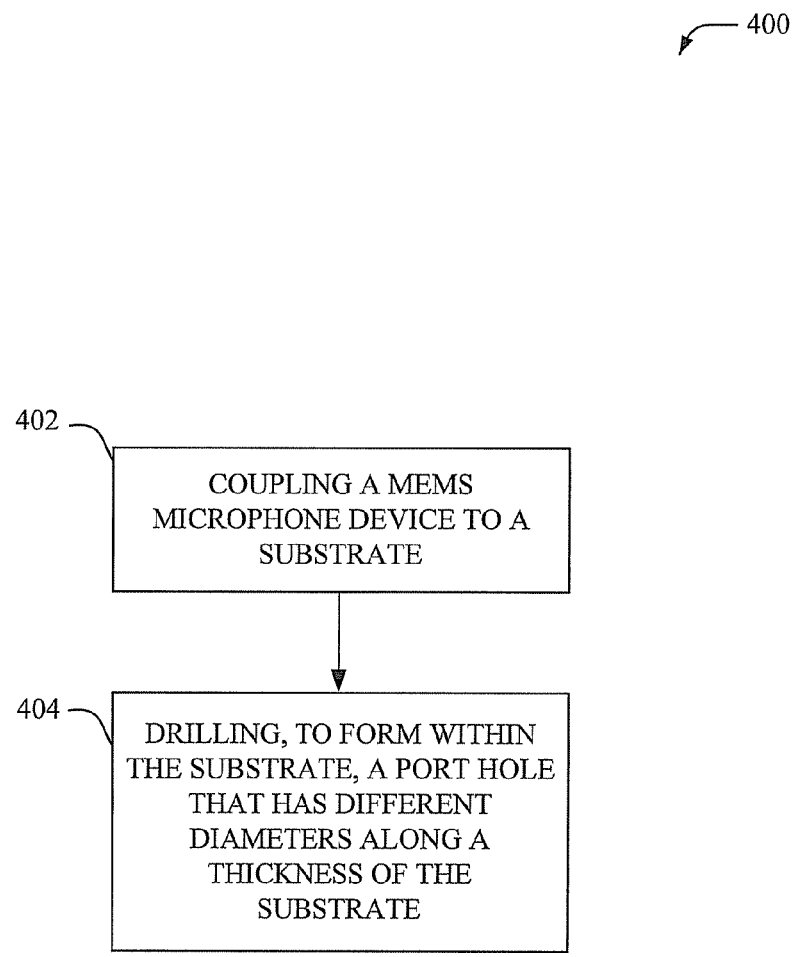
FIG. 4 illustrates an example methodology for forming a port hole in a MEMS microphone package.
Figure 5:
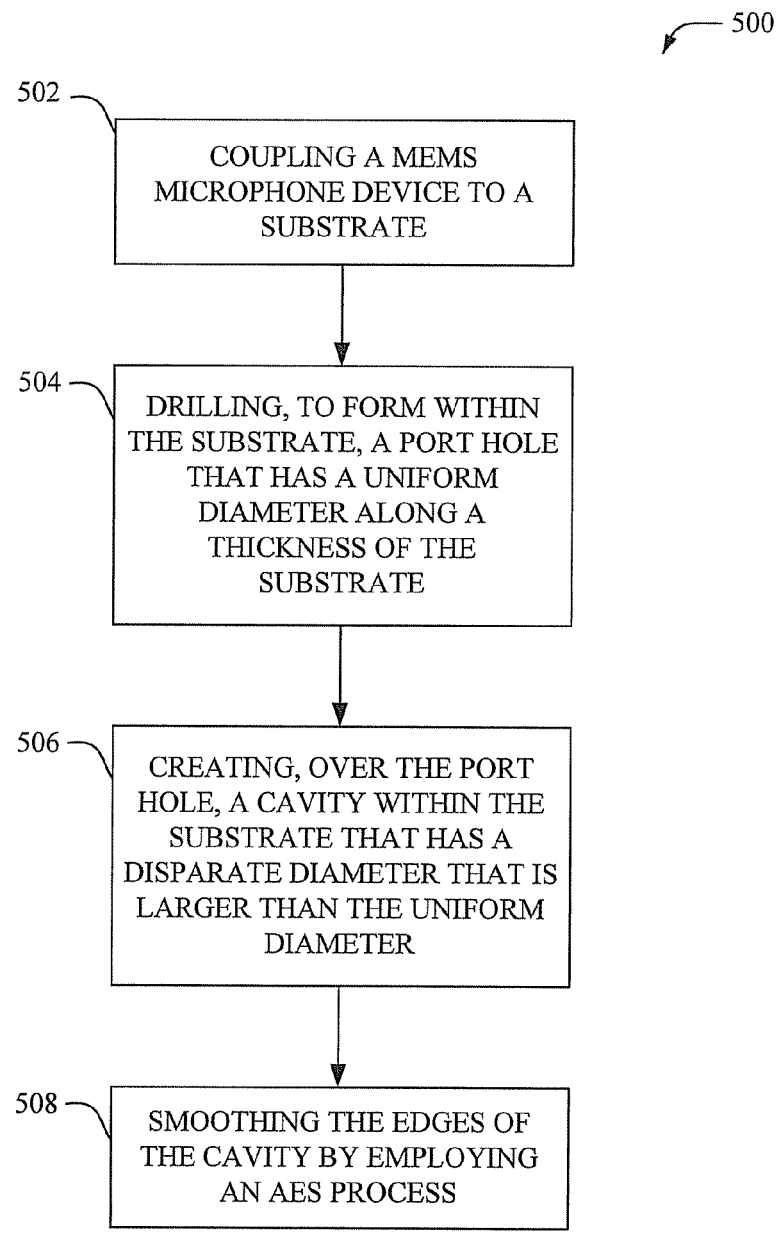
FIG. 5 illustrates an example methodology for forming a cavity over a port hole of a MEMS microphone package.
Figure 6:
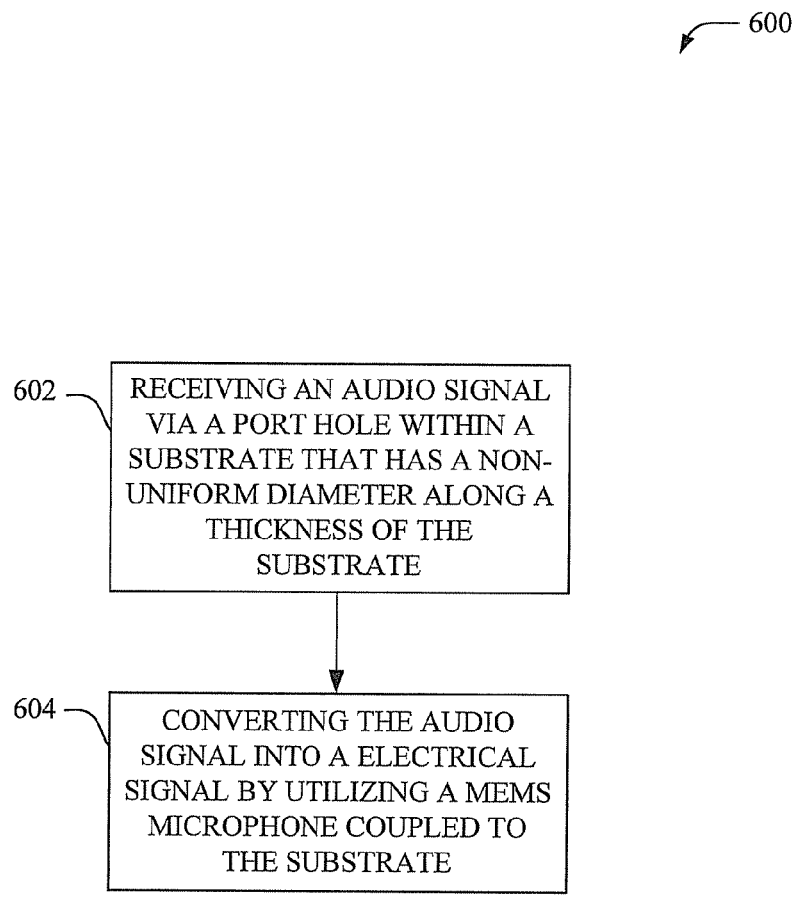
FIG. 6 illustrates an example methodology for sensing an audio signal.

FIGS. 4-6 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device or computer-readable storage/communications media.

FIG. 4 illustrates an example methodology 400 for forming a port hole for a MEMS microphone package in accordance with an aspect of the subject disclosure. Specifically, methodology 400 balances a trade-off between protecting the MEMS microphone from environmental interference and increasing a performance of the MEMS microphone. At 402, a MEMS microphone device is coupled to a substrate (e.g., with conductive or non-conductive epoxy). As an example, the substrate can comprise a printed circuit board, ceramic, molded package, laminate, and/or leadframe, etc. In one aspect, the coupling comprises wire-bonding the MEMS microphone device to the substrate. In another aspect, the coupling comprises forming a eutectic bond between the MEMS microphone device and the substrate. Further, the MEMS microphone device can be coupled to the substrate in most any configuration, for example, a flip chip configuration or an upright configuration. Furthermore, the MEMS microphone device can be coupled to an ASIC that is also coupled to the substrate. For example, the MEMS microphone device and the ASIC can be placed adjacent to each other over the substrate or the ASIC can be placed between the MEMS microphone device and the substrate.

At 404, a port hole that has different diameters along a thickness of the substrate can be formed by drilling an aperture within the substrate. As an example, the port hole can be formed by mechanical and/or laser drilling (e.g., during a fabrication of the substrate and/or at most any other time). In one example, the port hole has a smaller (e.g., fixed size based on customer specifications and/or motherboard design) diameter at (or closer to) the bottom surface of the substrate (e.g., the surface that couples to the board) and a larger diameter at (or closer to) the top surface of the substrate (e.g., the surface that is closer to or coupled to the MEMS microphone device). Moreover, a port hole of most any shape or size that has a fixed/small diameter at (or closer to) the bottom surface can be formed. Since the diameter of the port hole is fixed/small at (or closer to) the bottom surface, the MEMS microphone device can be protected from environmental interference and/or disturbances. In addition, since the diameter of the port hole is larger at (or closer to) the top surface, the air mass loading and air flow resistance is reduced and thus, the resonant frequency, resonant peak, SNR and/or a range for flat frequency response of the MEMS microphone device can be increased.

FIG. 5 illustrates an example methodology 500 for forming a cavity over a port hole of a MEMS microphone package in accordance with an aspect of the subject disclosure. Specifically, methodology 500 increases a performance of the MEMS microphone by increasing a size of the port hole. At 502, a MEMS microphone device is coupled to a substrate (e.g., with conductive or non-conductive epoxy). As an example, the substrate can comprise a printed circuit board, ceramic, molded package, laminate, and/or leadframe, etc. In one aspect, the coupling comprises wire-bonding the MEMS microphone device to the substrate. In another aspect, the coupling comprises forming a eutectic bond between the MEMS microphone device and the substrate. Further, the MEMS microphone device can be coupled to the substrate in most any configuration, for example, a flip chip configuration or an upright configuration. Furthermore, the MEMS microphone device can be coupled to an ASIC that is also coupled to the substrate. For example, the MEMS microphone device and the ASIC can be placed adjacent to each other over the substrate or the ASIC can be placed between the MEMS microphone device and the substrate.

At 504, a port hole that has a uniform diameter (e.g., fixed based on customer specification and/or board design) can be formed by drilling within the substrate. As an example, the port hole can be formed by mechanical and/or laser drilling (e.g., during a fabrication of the substrate and/or at most any other time). At 506, a cavity, having a disparate diameter that is larger than the uniform diameter, can be created in the substrate over the port hole. The ratio of the length of the cavity to the thickness of the substrate can be kept close to (but not equal to) 1 (e.g., 0.6-0.7). As an example, the cavity can be formed over a drilled hole by punch or laser drilling (e.g. removing/burning a portion of the substrate over the port hole). In one aspect, the port hole with the uniform diameter is drilled at the bottom surface of the substrate (e.g., the surface that couples to the motherboard) and the cavity with the larger diameter is created at (or closer to) the top surface of the substrate (e.g., the surface that is closer to or coupled to the MEMS microphone device). Moreover, the cavity can be of most any shape or size (e.g., having a diameter that is larger than the diameter of the port hole). At 508, the edges of the cavity can be made smooth by a cleaning/edging process (e.g., AES process). Since the diameter of the port hole is fixed/small at (or closer to) the bottom surface, the MEMS microphone device can be protected from environmental interference and/or disturbances. In addition, since the diameter of the cavity is larger at (or closer to) the top surface, the air mass loading and air flow resistance is reduced and thus, the resonant frequency, resonant peak, SNR and/or a range for flat frequency response of the MEMS microphone device can be increased.

FIG. 6 illustrates an example methodology 600 for sensing an audio signal, according to an aspect of the subject disclosure. At 602, an audio signal can be received via a port hole within a substrate (e.g., a printed circuit board, ceramic, molded package, laminate, and/or leadframe, etc.) that has a non-uniform diameter along the thickness of the substrate. In one aspect, the port hole can be created by mechanical and/or laser drilling (e.g., during a fabrication of the substrate and/or at most any other time). In another aspect, the port hole can be created by forming a large cavity in the substrate over a drilled port hole. Typically, the port hole has a smaller (e.g., fixed size based on customer specifications and/or board design) diameter at (or closer to) the bottom surface of the substrate and a larger diameter at (or closer to) the top surface of the substrate. At 604, the audio signal is converted into an electrical signal by utilizing a MEMS microphone coupled to the substrate (e.g., via a wire bond or eutectic bond). The electrical signal can be transmitted to an ASIC for further processing.

What has been described above includes examples of the subject disclosure. It is, of course, not possible to describe every conceivable combination of components or methodologies for purposes of describing the subject matter, but it is to be appreciated that many further combinations and permutations of the subject disclosure are possible. Accordingly, the claimed subject matter is intended to embrace all such alterations, modifications, and variations that fall within the spirit and scope of the appended claims.

In particular and in regard to the various functions performed by the above described components, devices, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter.

The aforementioned systems have been described with respect to interaction between several components. It can be appreciated that such systems and/or components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components, and any one or more middle layers, may be provided to communicatively couple to such sub-components in order to provide integrated functionality. Any components described herein may also interact with one or more other components not specifically described herein.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A device, comprising:
   a micro-electro-mechanical (MEMS) microphone device; and
   a substrate, coupled to the MEMS microphone device, having a top surface and a bottom surface,
   wherein the MEMS microphone device is coupled to the top surface, the substrate comprises a port hole that has a first diameter at a first position closer to the top surface and a second diameter at a second position closer to the bottom surface, and
   wherein the first diameter is made larger than the second diameter to improve a performance of the MEMS microphone device.

2. The device of claim 1, wherein the second diameter is determined based on a design of a motherboard to which the device is to be attached.

3. The device of claim 1, wherein the first position is on the bottom surface of the substrate and the second position is on a top surface of the substrate.

4. The device of claim 1, wherein the MEMS microphone device is aligned with the port hole.

5. The device of claim 1, wherein the MEMS microphone device is not aligned with the port hole.

6. The device of claim 1, wherein the MEMS microphone device is coupled to the substrate via a wire bond.

7. The device of claim 1, wherein the MEMS microphone device has a flip chip configuration and is electrically coupled to the substrate.

8. The device of claim 1, wherein the MEMS microphone device is located on and coupled to an application-specific integrated circuit (ASIC) that is coupled to the substrate.

9. The device of claim 8, wherein the MEMS microphone device is coupled to the ASIC via at least one of a wire bond or a eutectic bond.

10. The device of claim 1, wherein the MEMS microphone device is coupled to an application-specific integrated circuit (ASIC) and wherein the MEMS microphone device and the ASIC are located on and coupled to the substrate.

11. The device of claim 1, wherein the port hole comprises an aperture formed by at least one of mechanically drilling or laser drilling the substrate.

12. The device of claim 1, wherein the port hole comprises at least one of a pre-molded or drilled cavity formed in the substrate.

13. The device of claim 1, wherein the substrate comprises at least one of a printed circuit board, ceramic, molded package, laminate, or leadframe.

14. A method, comprising:
    coupling a micro-electro-mechanical (MEMS) microphone device to a top surface of a substrate; and
    forming a port hole within the substrate, wherein the port hole has a first diameter at a first position that is closer to the top surface than a second diameter at a second position of the substrate and wherein the first diameter is made larger than the second diameter to improve a performance of the MEMS microphone device.

15. The method of claim 14, wherein the forming comprises at least one of mechanically drilling or laser drilling the port hole in the substrate.

16. The method of claim 14, wherein the forming comprises creating a cavity in the substrate.

17. The method of claim 14, further comprising:
customizing the second diameter based on specification data associated with a device to which the MEMS microphone device is to be coupled.

18. The method of claim 14, wherein the forming comprises forming the port hole having the first diameter on the bottom surface and the second diameter on the top surface.

19. The method of claim 14, wherein the forming comprises forming the port hole during a fabrication process associated with the substrate.

20. The method of claim 14, wherein the coupling comprises wire-bonding the MEMS microphone device to the substrate.

21. The method of claim 14, wherein the MEMS microphone device has a flip chip configuration and the coupling comprises electrically coupling the MEMS microphone device to the substrate.

22. The method of claim 14, wherein the coupling comprises coupling the MEMS microphone device to the substrate via an application-specific integrated circuit (ASIC) that is placed between the MEMS microphone device and the substrate.

23. The method of claim 14, further comprising:
coupling an application-specific integrated circuit (ASIC) to the substrate, wherein the ASIC is placed between the MEMS microphone device and the substrate.

24. A micro-electro-mechanical (MEMS) microphone, comprising:
a MEMS device that facilitates a conversion of an acoustic signal into an electrical signal, wherein the MEMS device is coupled to a top surface of a substrate; and
an aperture within the substrate, though which the acoustic signal is received, wherein the aperture has a first diameter at a first position that is closer to the top surface than a second diameter at a second position that is further away from the top surface and wherein the first diameter is made larger than the second diameter to improve a performance of the MEMS microphone.

* * * * *